(12) United States Patent
Griffiths

(10) Patent No.: US 8,339,207 B2
(45) Date of Patent: Dec. 25, 2012

(54) SYSTEM AND METHOD FOR EFFECTIVELY IMPLEMENTING A LOOP FILTER DEVICE

(75) Inventor: Bernard J. Griffiths, Ben Lomond, CA (US)

(73) Assignees: Sony Corporation, Tokyo (JP); Sony Electronics Inc., Park Ridge, NJ (US)

( * ) Notice: Subject to any disclaimer, the term of this patent is extended or adjusted under 35 U.S.C. 154(b) by 214 days.

(21) Appl. No.: 12/220,214

(22) Filed: Jul. 23, 2008

(65) Prior Publication Data
US 2010/0019854 A1      Jan. 28, 2010

(51) Int. Cl.
*H03L 7/00* (2006.01)
(52) U.S. Cl. .................. 331/16; 331/177 R; 331/34
(58) Field of Classification Search ............ 331/16, 331/34, 177 R, 36 C
See application file for complete search history.

(56) References Cited

U.S. PATENT DOCUMENTS

| | | | |
|---|---|---|---|
| 6,600,351 B2 | 7/2003 | Bisanti et al. | |
| 6,995,607 B2* | 2/2006 | Dosho et al. | 327/558 |
| 7,078,948 B2 | 7/2006 | Dosho | |
| 7,283,004 B2 | 10/2007 | Guenais | |
| 2001/0017572 A1* | 8/2001 | Harpham | 331/14 |
| 2006/0267644 A1 | 11/2006 | Youssoufian et al. | |

* cited by examiner

*Primary Examiner* — Arnold Kinkead
(74) *Attorney, Agent, or Firm* — Gregory J. Koerner; Redwood Patent Law

(57) ABSTRACT

A system and method for effectively generating an electronic control signal includes a loop filter that has a first capacitor, a second capacitor, and a damping resistor. The first capacitor typically has a significantly greater capacitance than said second capacitor. A primary charge pump provides a primary charge current to the loop filter, and a damping charge pump provides a damping charge current to the loop filter. The loop filter responsively generates the electronic control signal for regulating the output frequency of a voltage-controlled oscillator. All components of the loop filter are sized to be implemented as part of an integrated circuit device.

20 Claims, 9 Drawing Sheets

SYSTEM AND METHOD FOR EFFECTIVELY IMPLEMENTING A LOOP FILTER DEVICE

BACKGROUND SECTION

1. Field of the Invention

This invention relates generally to techniques for transferring electronic information, and relates more particularly to a system and method for effectively implementing a loop filter device.

2. Description of the Background Art

Implementing effective methods for transferring electronic information is a significant consideration for designers and manufacturers of contemporary electronic systems. However, effectively implementing data transfer systems may create substantial challenges for system designers. For example, enhanced demands for increased system functionality and performance may require more system processing power and require additional hardware resources. An increase in processing or hardware requirements may also result in a corresponding detrimental economic impact due to increased production costs and operational inefficiencies.

Furthermore, enhanced system capability to perform various advanced transfer operations may provide additional benefits to a system user, but may also place increased demands on the control and management of various system components. For example, an enhanced electronic system that effectively transfers digital image data may benefit from an effective implementation because of the large amount and complexity of the digital data involved.

Due to growing demands on system resources and substantially increasing data magnitudes, it is apparent that developing new techniques for implementing and utilizing data transfer systems is a matter of concern for related electronic technologies. Therefore, for all the foregoing reasons, developing effective systems for transferring electronic information remains a significant consideration for designers, manufacturers, and users of contemporary electronic systems.

SUMMARY

In accordance with the present invention, a system and method are disclosed for effectively implementing a loop filter device. In accordance with one embodiment of the present invention, a phase-locked loop (PLL) performs a clock regeneration procedure to regenerate a primary clock signal from a voltage-controlled oscillator for synchronizing any appropriate devices or processes. The PLL includes a loop filter that generates a VCO control signal to regulate the frequency of the VCO.

In one embodiment, the loop filter includes a capacitor C1 that has a first end connected to a loop filter output. Capacitor C1 has a second end that is connected to a first end of a damping resistor Rd. A second end of the damping resistor Rd is connected to ground. The loop filter also includes a capacitor C2 that has a first end connected to the loop filter output and a second end that is connected to ground.

An ICP output current of a primary charge pump is connected to the first end of capacitor C1 and also to the first end of capacitor C2 at the loop filter output. Depending upon whether the primary charge pump receives an up signal or a down signal, a corresponding switch is closed in the primary charge pump to provide an appropriate ICP output current to the loop filter.

In addition, an IRD output current of a damping charge pump is connected to the junction of capacitor C1 and damping resistor Rd. More specifically, damping charge pump provides the IRD output current to the point where the second end of capacitor C1 joins the first end of damping resistor RD. Depending upon whether the damping charge pump receives an up signal or a down signal, a corresponding switch is closed in the damping charge pump to provide an appropriate IRD output current to the loop filter.

Because of the foregoing arrangement, all components (C1, C2, Rd, and the two charge pumps) may efficiently be incorporated within an integrated circuit device where the relative size of the various components is a significant consideration. For at least the foregoing reasons, the present invention therefore provides an improved system and method for effectively implementing a loop filter device.

DETAILED DESCRIPTION

The present invention relates to an improvement in data transmission systems. The following description is presented to enable one of ordinary skill in the art to make and use the invention, and is provided in the context of a patent application and its requirements. Various modifications to the disclosed embodiments will be readily apparent to those skilled in the art, and the generic principles herein may be applied to other embodiments. Thus, the present invention is not intended to be limited to the embodiments shown, but is to be accorded the widest scope consistent with the principles and features described herein.

The present invention is described herein as a system and method for effectively generating an electronic control signal, and includes a loop filter that has a first capacitor, a second capacitor, and a damping resistor. The first capacitor typically has a significantly greater capacitance than said second capacitor. A primary charge pump provides a primary charge current to the loop filter, and a damping charge pump provides a damping charge current to the loop filter. The loop filter responsively generates the electronic control signal for regulating the output frequency of a voltage-controlled oscillator. All components of the loop filter are advantageously sized to be implemented as part of an integrated circuit device.

Figure 1:
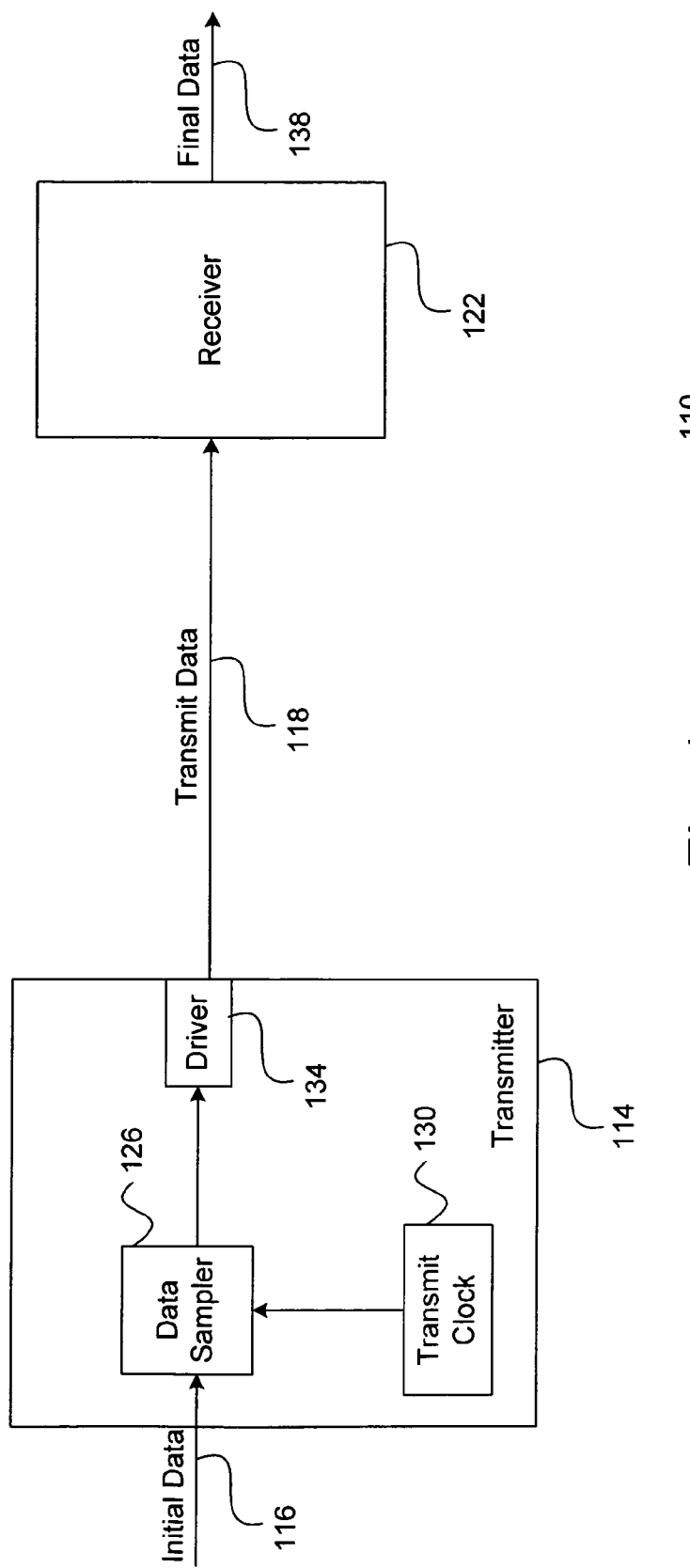
FIG. 1 is a block diagram of a data transmission system, in accordance with one embodiment of the present invention.

Referring now to FIG. 1, a block diagram of a data transmission system 110 is shown, in accordance with one embodiment of the present invention. In the FIG. 1 embodiment, data transmission system 110 includes, but is not limited to, a transmitter 114 and a receiver 122. In alternate embodiments, data transmission system 110 may be implemented using components and configurations in addition to, or instead of, certain of those components and configurations discussed in conjunction with the FIG. 1 embodiment.

In the FIG. 1 embodiment of data transmission system 110, a transmitter 114 utilizes a data sampler 126 to receive initial data 116 from any appropriate data source. Data sampler 126 synchronizes the initial data 116 with reference to a transmit clock 130. A driver 134 then outputs the synchronized initial data 116 over any appropriate type of transmission channel as transmit data 118. A receiver 122 of data transmission system 110 may then receive and process the transmit data 118 to thereby provide final data 138 to any appropriate data destination.

Data transmission system 110 therefore may transfer any desired type of electronic data or information between two separate locations via a transmission channel. These locations may be considerably distant (for example, between continents or between satellites), or may alternately be relatively close to each other (for example, between devices inside electronic equipment). A wide range of physical transmission media may be used to facilitate this transmission. Examples include electromagnetic waves in free space (wireless transmission), or electromagnetic waves in a constrained media (optical fiber, waveguides, cables, etc.).

This transmit data 118 is typically processed into a format that is suitable for transmission across the channel in a manner that maximizes intelligibility (a low incidence of error at the receiver 122, that has a low bit-error rate (BER), that maximizes the data throughput rate (measured in bits/second or symbols/second), and that minimizes certain cost factors such as transmission power, implementation complexity, and maximize spectral efficiency.

One method of processing involves serializing the initial data 116 before transmission, so that each data bit is represented by a unique symbol. These symbols are transmitted across the channel at a particular rate, controlled by transmit clock 130 of transmitter 114. To accurately receive and de-serialize these encoded symbols with a low BER, the receiver 122 may regenerate a local receiver clock that is similar to the transmit clock 130 of transmitter 114 with respect to frequency and phase. This synchronization of the receiver clock to the frequency and phase of incoming transmit data 118 may be advantageously performed by a Phase Locked Loop (PLL) device during a clock regeneration procedure. Further details regarding the implementation and utilization of receiver 122 are further discussed below in conjunction with FIGS. 2-9.

Figure 2:
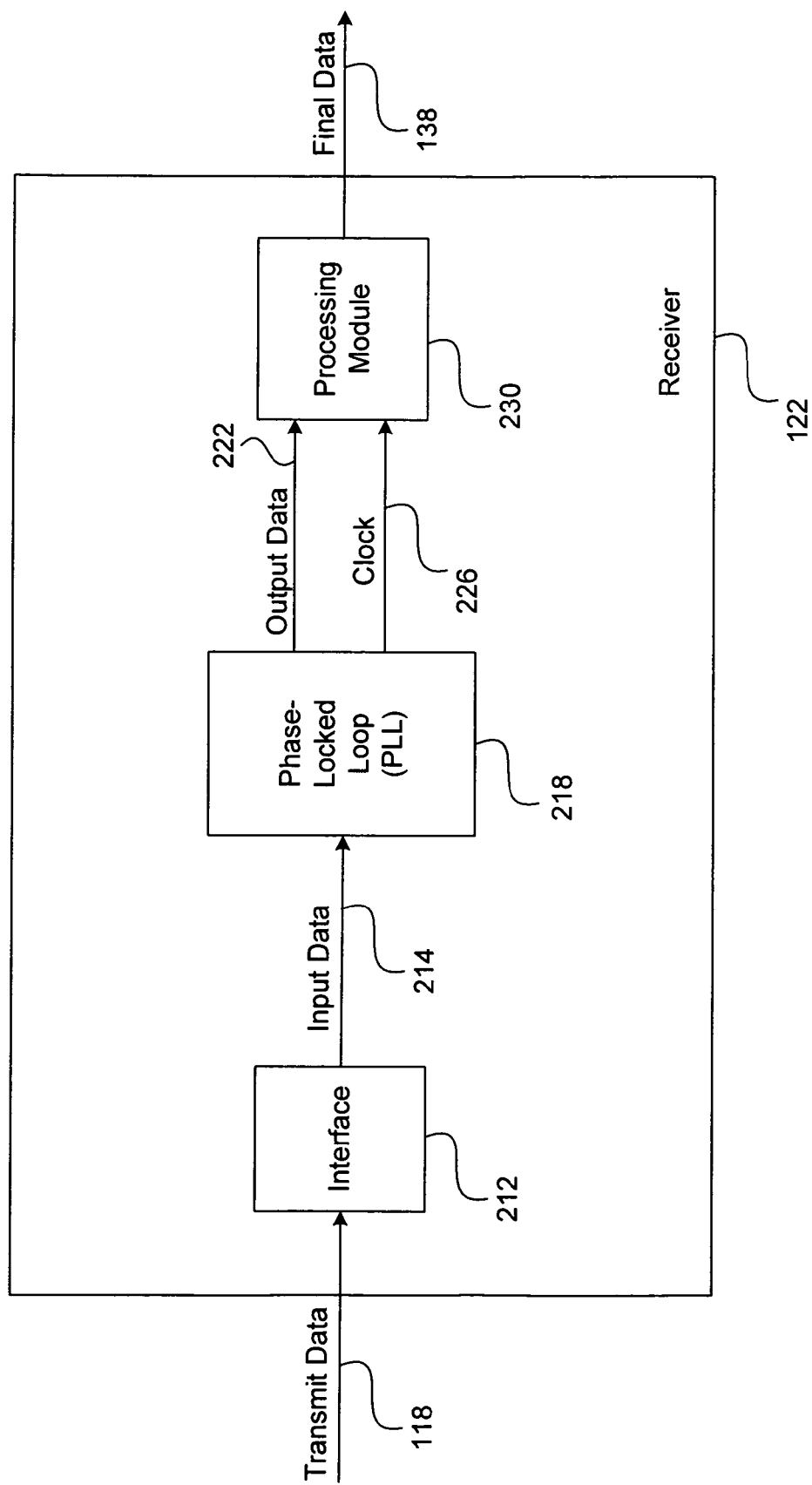
FIG. 2 is a block diagram for one embodiment of the receiver of FIG. 1, in accordance with the present invention.

Referring now to FIG. 2, a block diagram for one embodiment of the FIG. 1 receiver 122 is shown, in accordance with the present invention. In the FIG. 2 embodiment, receiver 122 may include, but is not limited to, an interface 212, a phase-locked loop (PLL) 218, and a processing module 230. In alternate embodiments, receiver 122 may be implemented using components and configurations in addition to, or instead of, certain of those components and configurations discussed in conjunction with the FIG. 2 embodiment. In various embodiments, receiver 122 may be implemented as any other appropriate type of electronic device.

In the FIG. 2 embodiment, transmit data 118 may be received from any desired data source, and may be encoded in any appropriate data format. For example, in certain embodiments, transmit data 118 may be received from a transmitter 114 of a data transmission system 110 (FIG. 1). In the FIG. 2 embodiment, an interface 212 of receiver 122 converts transmit data 118 into corresponding input data 214. In the FIG. 2 embodiment, a phase-locked loop (PLL) 218 receives input data 214, and responsively performs a clock regeneration procedure to produce a clock signal 226. A processing module 230 may receive output data 222 and clock 226 for performing any appropriate processing procedures to thereby produce final data 138. Certain additional details for the implementation and utilization of PLL 218 are further discussed below in conjunction with FIGS. 3-9.

Figure 3:
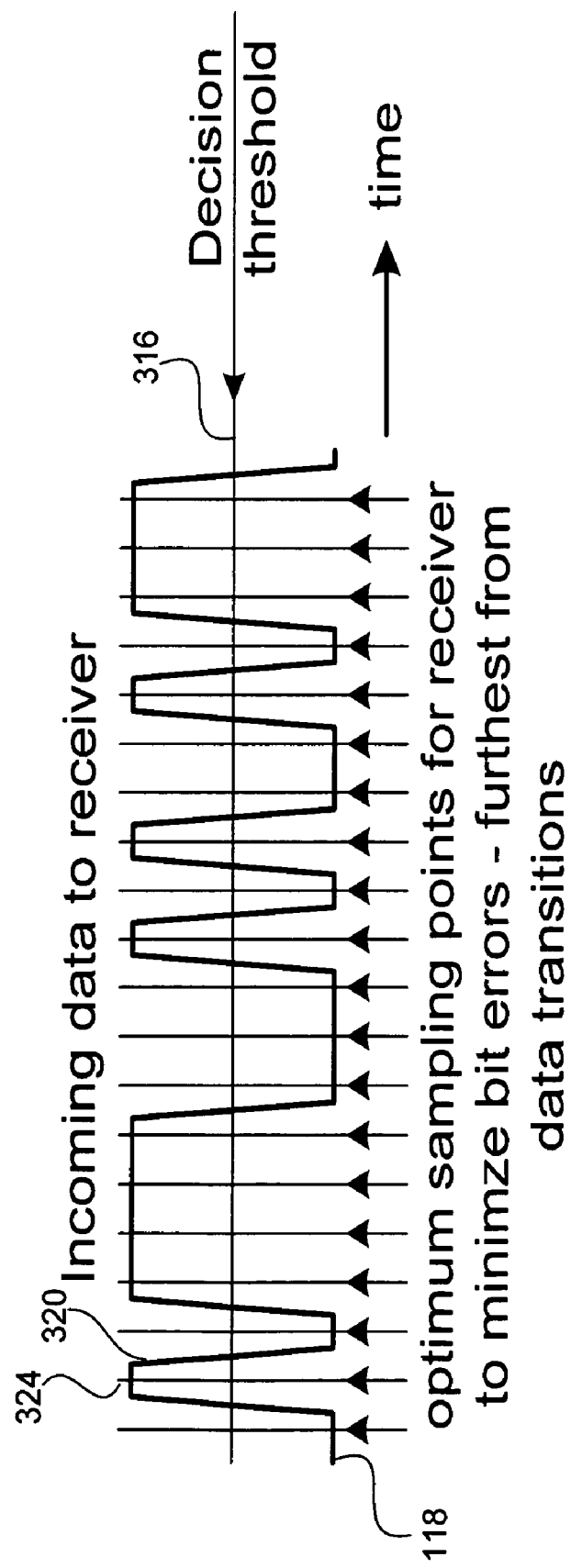
FIG. 3 is a diagram illustrating optimum data sampling points, in accordance with one embodiment of the present invention.

Referring now to FIG. 3, a diagram illustrating optimum data sampling points is shown, in accordance with one embodiment of the present invention. The FIG. 3 diagram is presented for purposes of illustration, and in alternate embodiments, the present invention may utilize techniques and timing relationships in addition to, or instead of, certain of those techniques and timing relationships discussed in conjunction with the FIG. 3 embodiment.

In the FIG. 3 embodiment, exemplary pulses of incoming data 118 to receiver 122 (FIG. 1) are shown. A decision threshold 316 for determining either a high or low state for incoming data 118 is also shown. The FIG. 3 embodiment also shows a sequence of optimal sampling points for receiver 122 to read the current state of the pulses of incoming data 118. For example, the FIG. 3 diagram shows a first pulse 320 of incoming data 118 aligned with a corresponding optimum sampling point that occurs at time 324.

Because of various potential types of noise, transition edge skewing, jitter, and other signal artifacts on the rising or falling transitions of incoming data 118, receiver 122 requires a regenerated clock 226 that aligns incoming data 118 so that the data sampling points occur during the middle of the corresponding data pulses (away from the respective transition edges). To accurately determine the clock phase error, receiver 122 must make a decision regarding the temporal position of an incoming data transition with respect to the receiver local clock 226.

Therefore, receiver 122 defines one or more decision thresholds 316, and when the incoming data 118 crosses decision threshold 316, receiver 122 is able to determine phase information. Receiver 122 may thus align the receiver local clock 226 (FIG. 2) to the optimum time position with respect to the incoming data 118. The receiver local clock 226 is then able to sample the incoming data 118, and then using the same or another decision threshold 316, make a determination as to the state of the received bits. The FIG. 3 diagram illustrates the relationship between the incoming data 118 and the optimum sampling points aligned with the regenerated phase-locked clock 226 of receiver 122. As discussed above, the optimum sampling points are in the center of the pulses of the incoming data 118. In other words, the optimum sampling points are at locations furthest from the adjacent data transitions.

Figure 4:
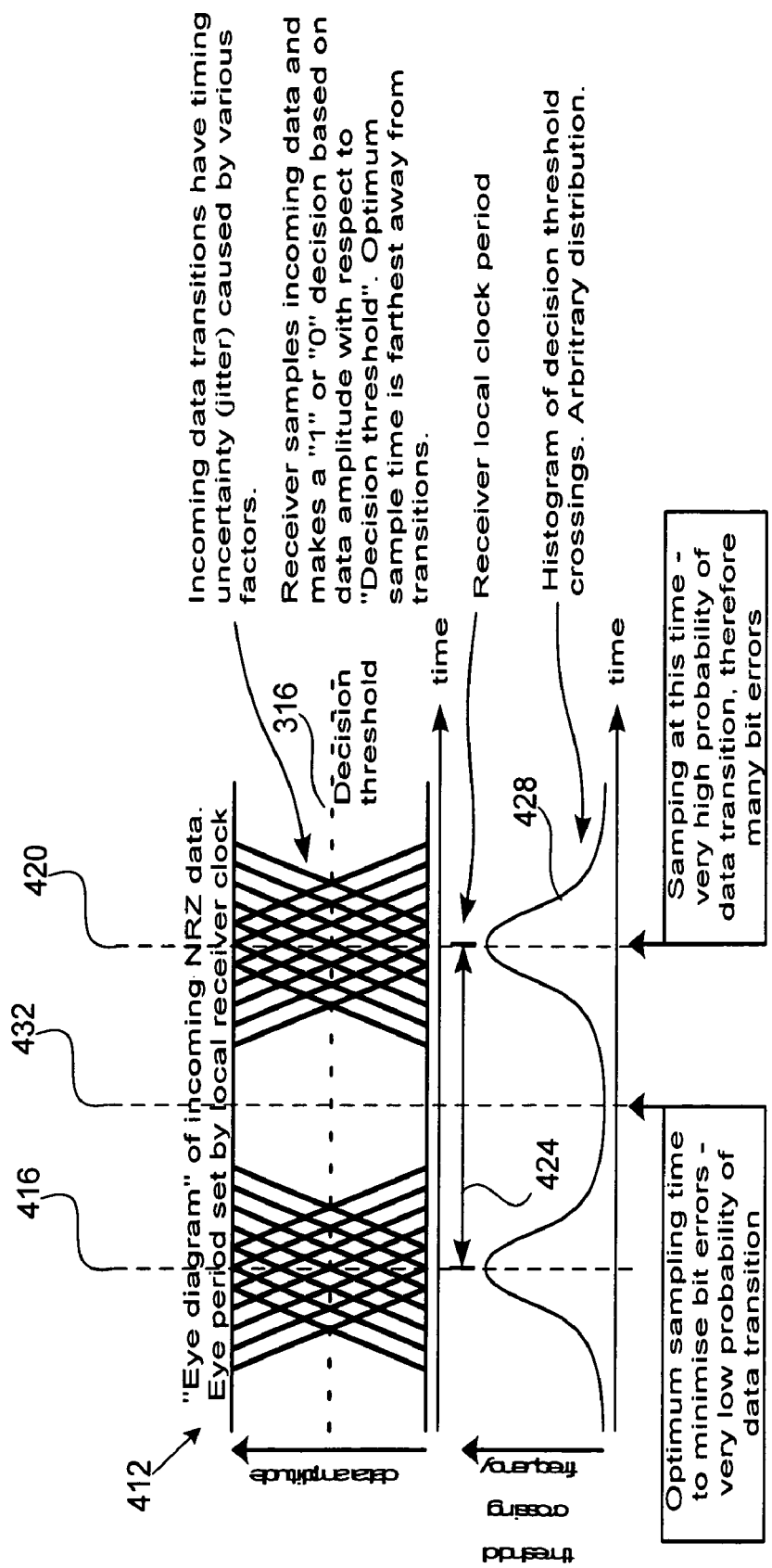
FIG. 4 is an eye diagram and corresponding histogram, in accordance with one embodiment of the present invention.

Referring now to FIG. 4, an eye diagram 412 and corresponding histogram 428 are shown to illustrate optimal clock timing characteristics, in accordance with one embodiment of the present invention. The FIG. 4 eye diagram 412 and histogram 428 are presented for purposes of illustration. In alternate embodiments, the present invention may utilize techniques and timing relationships in addition to, or instead of, certain of those techniques and timing relationships discussed in conjunction with the FIG. 4 embodiment.

The incoming data 118 to the receiver 122 (FIG. 1) exhibits variations in bit width over time. Such variation is termed jitter. Jitter includes a random component caused, for example, by noise at the transmitter 114 and/or in the environment. Jitter also includes a deterministic component caused, for example, by attenuation and bandwidth-limiting in the transmission channel and/or interference from other sources. The presence of jitter causes the incoming data transitions to move temporally with respect to the receiver local clock 226.

If the jitter is too great, or if the receiver local clock period 424 is poorly phase-aligned to the incoming data 118, then bit errors may likely increase in the receiver 122 as the receiver clock 226 samples closer to data transitions with a higher probability of making an error in the bit state determination. This phenomenon is demonstrated in FIG. 4. Eye diagram 412 is a plot of the incoming data 118, after being divided into segments corresponding to individual bit periods, each of the segments then being superimposed over the other segments in an eye diagram 412.

The eye region shown between time 416 and time 420, shows multiple superimposed data transitions, and how the transitions vary in time from a single ideal transition due to factors such as jitter. In the FIG. 4 embodiment, histogram 428 shows data transition frequency versus time. As shown in histogram 428, if receiver 122 samples close to the peaks of the histogram 428, then there is a higher probability that receiver 122 will make an erroneous bit-state determination. Therefore, the optimum sampling point is located at time 432 which is midway between the histogram peaks shown at times 416 and 420. In accordance with the present invention, accurately regenerating a local clock 226 allows receiver 122 to position optimum sampling points at time 432 to thereby advantageously tolerate a greater amount of jitter at a particular error rate.

Figure 5:
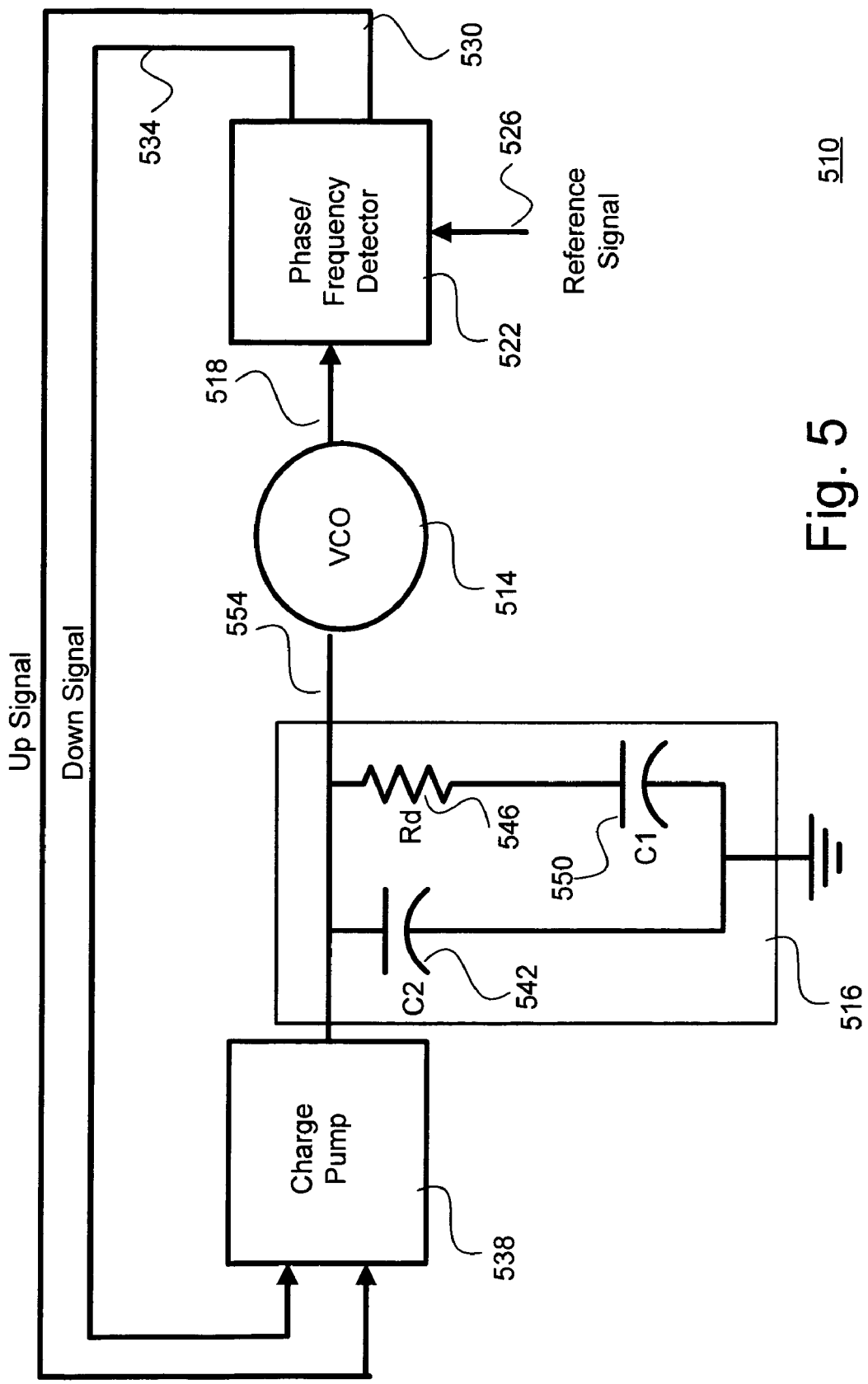
FIG. 5 is a schematic diagram for one embodiment of a phase-locked loop.

Referring now to FIG. 5, a schematic diagram for one embodiment of a phase-locked loop (PLL) 510 is shown. In the FIG. 5 embodiment, PLL 510 may include, but is not limited to, a voltage-controlled oscillator (VCO) 514, a phase/frequency detector 522, a charge pump 538, and a loop filter 516 (capacitor C2 (542), resistor Rd (546), and capacitor C1 (550)). In alternate embodiments, PLL 510 may be implemented using components and configurations in addition to, or instead of, certain of those components and configurations discussed in conjunction with the FIG. 5 embodiment.

In the FIG. 5 embodiment, PLL 510 performs a clock regeneration procedure to regenerate a clock signal 518 for synchronizing any appropriate devices or processes (for example, the receiver 122 of FIG. 2). In the FIG. 5 embodiment, a Voltage-Controller Oscillator (VCO) 514 generates the clock signal 518. Phase/frequency detector 522 compares the clock signal 518 to a reference signal 526 and provides either an up signal 530 or a down signal 534 to charge pump 538, depending upon whether the frequency of clock signal 518 needs to be raised or lowered to match reference signal 526. Charge pump 538 then provides charge pump output current to a loop filter 516 comprised of capacitor C2 (542), resistor Rd (546), and capacitor C1 (550). The components of the loop filter provide a VCO control voltage 554 to adjust the frequency of the clock signal 518 generated by VCO 514.

One problem with the PLL 510 of FIG. 5 is that capacitor C1 (550) is typically required to be implemented with a relatively large capacitance value which also results in a correspondingly large physical size. When implementing PLL 510 as an integrated circuit, the large size of capacitor C1 (550) prohibits its implementation as part of the integrated circuit, and instead, capacitor C1 (550) must typically be implemented as an external capacitor. This external implementation disadvantageously results in additional connection requirements, increased power consumption, and requires additional valuable physical space for implementing PLL 510. Alternate improved techniques for effectively implementing phase-locked loops are further discussed below in conjunction with FIGS. 7-9.

Figure 6:
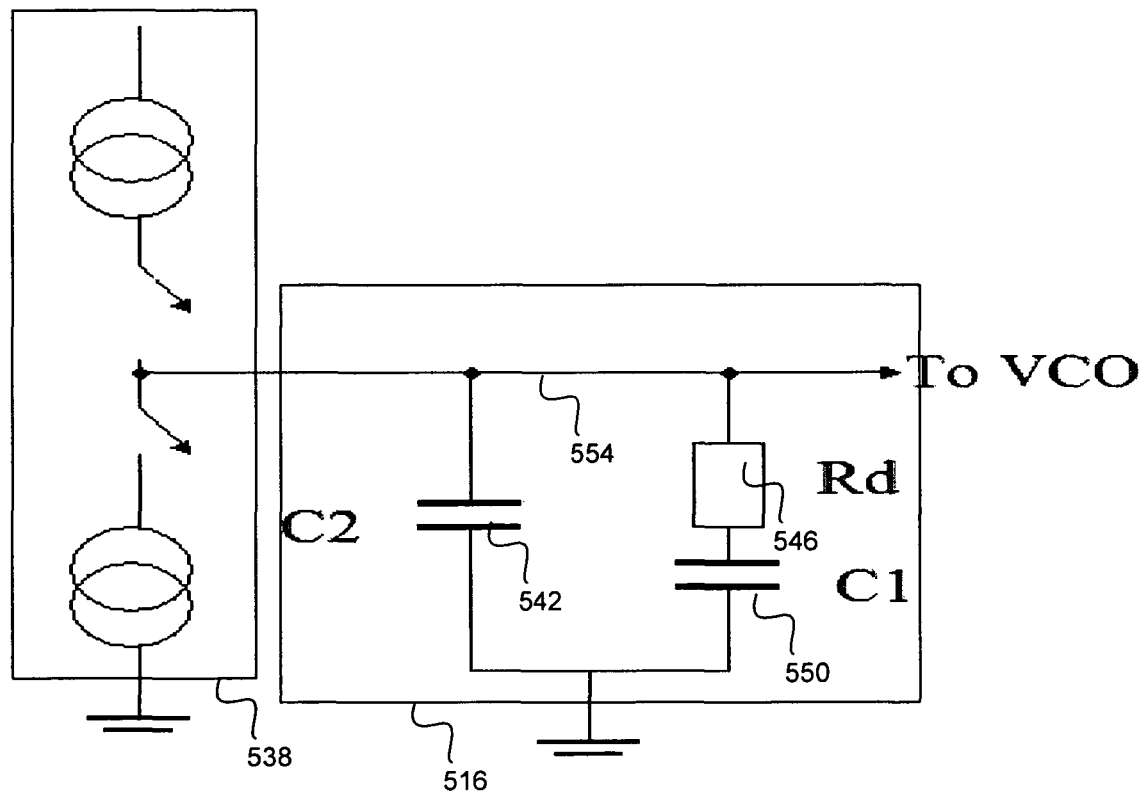
FIG. 6 is a schematic diagram for one embodiment of the loop filter and charge pump from FIG. 5.

Referring now to FIG. 6, a schematic diagram for one embodiment of the loop filter 516 and the charge pump 538 of FIG. 5 is shown. As discussed above, in order to include all components in an integrated circuit design, the relative size of the various components (especially C1) is a significant consideration. In the FIG. 6 embodiment, for appropriate operational characteristics, loop filter 516 should be implemented according to the following formula:

$$C2 < \frac{C1}{10}$$

where C1 is the capacitance of capacitor 550 and C2 is the capacitance of capacitor 542.

In the FIG. 6 embodiment, there is an additional natural parasitic capacitance (Cp) (not shown) between the loop filter output 554 and ground that results from the physical relationships of various circuit components. The parasitic capacitance is therefore essentially in parallel (added to) C2. Because the parasitic capacitance is fixed, there is limit beyond which C1 cannot be further reduced, while still maintaining the relationship defined by the formula above.

In the FIG. 6 embodiment, a natural frequency of the PLL 510 (FIG. 5) may be defined by the following formula:

$$Wn = \sqrt{\frac{Ki \cdot Kvco}{N * C1}}$$

where Wn is the natural frequency, omega n, Ki is a primary charge pump current ICP from primary charge pump 538, Kvco is the gain of VCO 514 (FIG. 5), and N is a loop divider value (if present). It will be noted that to maintain a constant value for the natural frequency (omega n), if C1 is lowered (to reduce the physical size), then the primary charge pump current ICP must also be reduced in compensation.

In the FIG. 6 embodiment, loop filter 516 should preferably maintain a target damping factor to ensure that a stable voltage is provided at loop filter output 554 to control VCO 514 (FIG. 5). The damping factor may be expressed according to the following formula:

$$\zeta = \frac{Rd * Wn * C1}{2}$$

where Rd is the resistance of damping resistor 546, Wn is the natural frequency (omega n), and C1 is the capacitance of capacitor 550. It will be noted in the FIG. 6 embodiment, that to maintain the target damping factor, since omega n is a constant value, if C1 is reduced (to reduce the physical size), then the value of the damping resistor 546 must be increased in compensation. Increasing the physical size of damping resistor 546 is not desirable in terms of effectively implementing PLL 510 (FIG. 5) as an integrated circuit. Several techniques for solving the problems inherent in the FIG. 6 embodiment are discussed below in conjunction with FIGS. 7-9.

Figure 7:
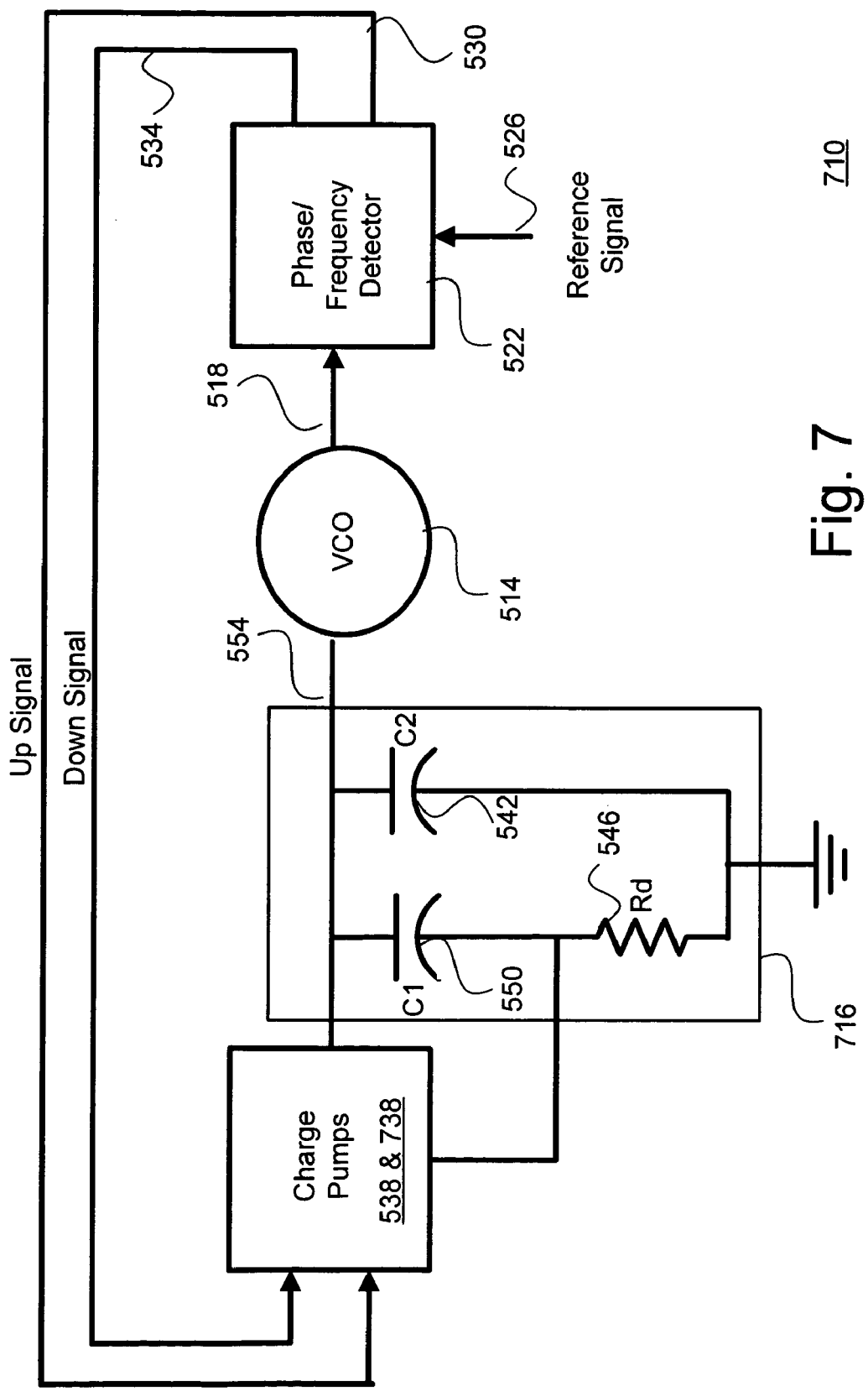
FIG. 7 is a schematic diagram for one embodiment of a phase-locked loop, in accordance with the present invention.

Referring now to FIG. 7, a schematic diagram for one embodiment of a phase-locked loop (PLL) 710 is shown, in accordance with the present invention. In the FIG. 7 embodiment, PLL 710 may include, but is not limited to, a voltage-controlled oscillator (VCO) 514, a phase/frequency detector 522, two charge pumps 538 and 738, and a loop filter 716

(capacitor C2 (542), resistor Rd (546), and capacitor C1 (550)). In alternate embodiments, PLL 710 may be implemented using components and configurations in addition to, or instead of, certain of those components and configurations discussed in conjunction with the FIG. 7 embodiment.

In the FIG. 7 embodiment, PLL 710 performs a clock regeneration procedure to regenerate a clock signal 518 for synchronizing any appropriate devices or processes (for example, the receiver 122 of FIG. 2). In the FIG. 7 embodiment, a Voltage-Controller Oscillator (VCO) 514 generates the clock signal 518. Phase/frequency detector 522 compares the clock signal 518 to a reference signal 526 and provides either an up signal 530 or a down signal 534 to charge pumps 538 and 738, depending upon whether the frequency of clock signal 518 needs to be raised or lowered to match reference signal 526. Charge pumps 538 and 738 then provide charge pump output currents to a loop filter 716 comprised of capacitor C2 (542), resistor Rd (546), and capacitor C1 (550). The components of the loop filter 716 provide a VCO control voltage 554 to adjust the frequency of the clock signal 518 generated by VCO 514. Further details regarding the implementation of loop filter 716 and charge pumps 538 and 738 are further discussed below in conjunction with FIG. 9.

Figure 8:
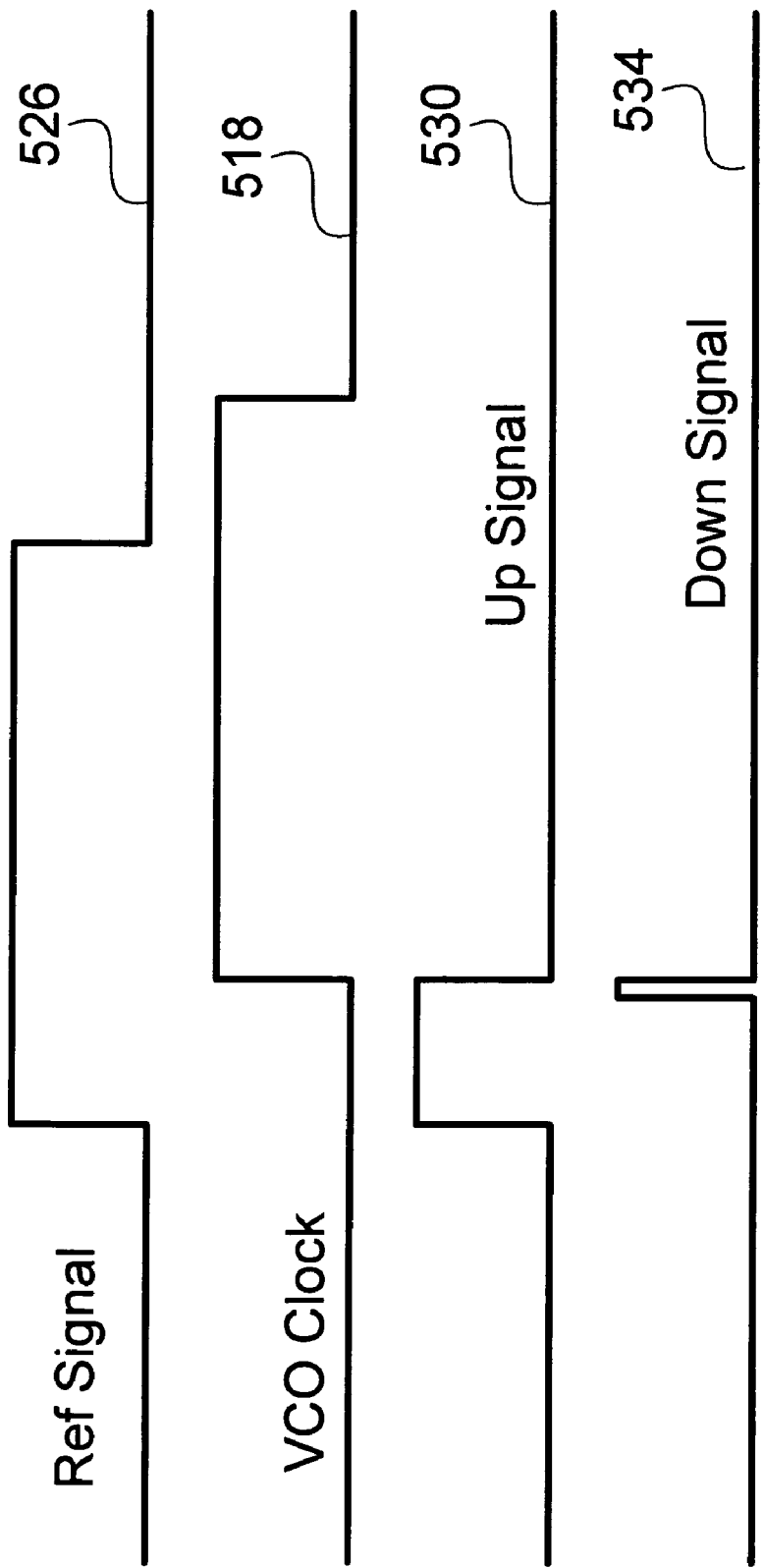
FIG. 8 is a timing diagram for one embodiment of a phase-locked loop.

Referring now to FIG. 8, a timing diagram for a phase-locked loop is shown, in accordance with one embodiment of the present invention. The FIG. 8 timing diagram is presented for purposes of illustration, and in alternate embodiments, phase-locked loops may be implemented using waveforms and timing relationships in addition to, or instead of, certain of those waveforms and timing relationships discussed in conjunction with the FIG. 8 embodiment. In the FIG. 8 example, reference signal 526 (see FIGS. 5 and 7) is shown leading clock signal 518 to generate an up signal pulse 530 (see FIGS. 5 and 7) for causing a clock VCO to increase its output frequency. In other circumstances, phase/frequency detectors may similarly generate a down signal pulse 534 (see FIGS. 5 and 7) when the clock signal 518 leads the reference signal 526.

Figure 9:
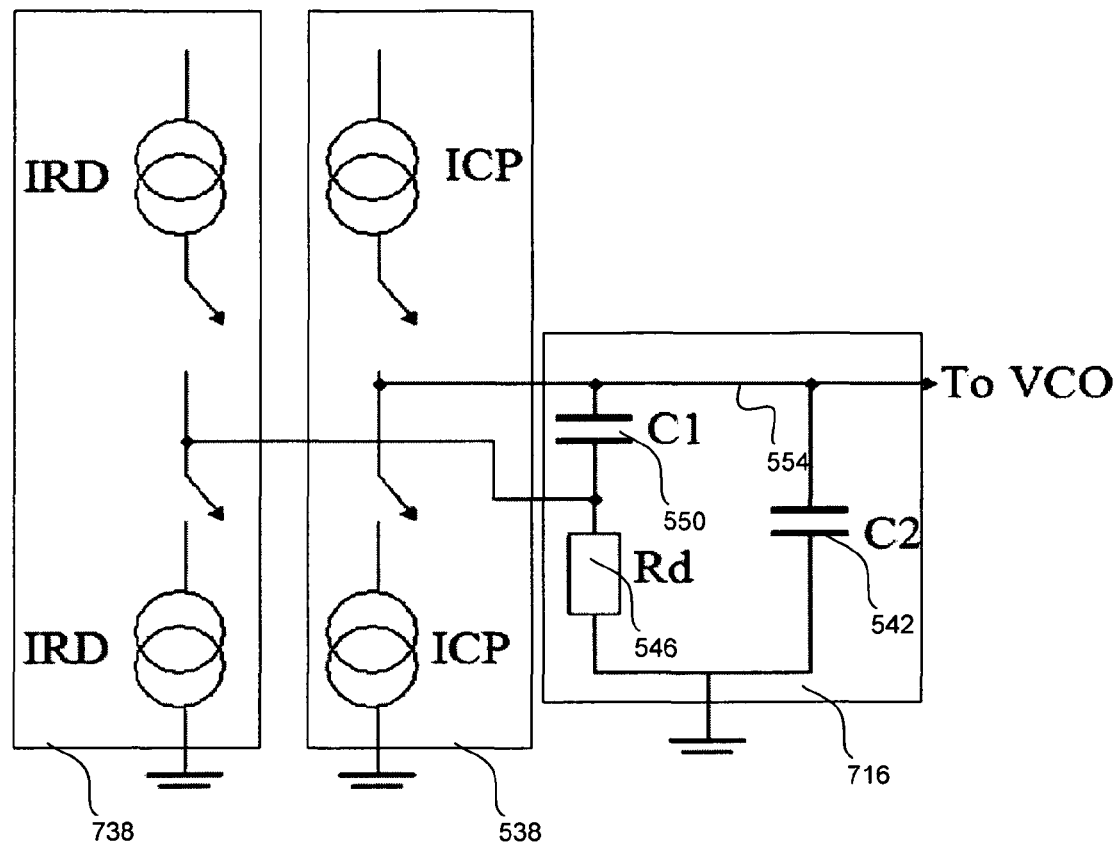
FIG. 9 is a schematic diagram for one embodiment of the loop filter and charge pumps from FIG. 7, in accordance with the present invention.

Referring now to FIG. 9, a schematic diagram for one embodiment of the loop filter 716 and charge pumps 538 and 738 from FIG. 7 is shown, in accordance with the present invention. In alternate embodiments, the present invention may be implemented using components and configurations in addition to, or instead of, certain of those components and configurations discussed in conjunction with the FIG. 9 embodiment.

In the FIG. 9 embodiment, loop filter 716 includes a capacitor C1 550 that has a first end connected to a loop filter output 554 and a second end that is connected to a first end of a damping resistor Rd 546. A second end of the damping resistor Rd 546 is connected to ground. Loop filter 716 also includes a capacitor C2 that has a first end connected to the loop filter output 554 and a second end that is connected to ground.

In the FIG. 9 embodiment, an ICP output current of a primary charge pump 538 is connected to the first end of capacitor C1 550 and the first end of capacitor C2 542 at the loop filter output 554. Depending upon whether charge pump 538 receives an up signal or a down signal, a corresponding switch is closed in charge pump 538 to provide an appropriate ICP output current to loop filter 716.

In addition, in the FIG. 9 embodiment, an IRD output current of a damping charge pump 738 is connected to the junction of capacitor C1 550 and damping resistor Rd 546. More specifically, damping charge pump 738 provides the IRD output to the point where the second end of capacitor C1 550 is connected to the first end of damping resistor RD 546. Depending upon whether charge pump 738 receives an up signal or a down signal, a corresponding switch is closed in charge pump 738 to provide an appropriate IRD output current to loop filter 716.

As discussed above, in order to include all components in an integrated circuit design, the relative size of the various components (especially C1) is a significant consideration. In the FIG. 9 embodiment, for appropriate operational characteristics, loop filter 716 should be implemented according to the following formula:

$$\frac{C1 * C2}{(C1 + C2)} < \frac{(C1 + C2)}{10}$$

where C1 is the capacitance of capacitor 550 and C2 is the capacitance of capacitor 542.

In the FIG. 9 embodiment, there is an additional natural parasitic capacitance (Cp) (not shown) between the loop filter output 554 and ground that results from the physical relationships of various circuit components. However, unlike the FIG. 6 embodiment, as damping resistor Rd 546 approaches zero in the FIG. 9 embodiment, the parasitic capacitance is essentially in parallel (combined with) both C2 and C1. Because the parasitic capacitance is combined with both C2 and C1, there is now no limit to how far C1 and C2 can be reduced, while still maintaining the relationship defined by the formula above.

In the FIG. 9 embodiment, a natural frequency of the PLL 710 (FIG. 7) may be defined by the following formula:

$$Wn = \sqrt{\frac{Ki \cdot Kvco}{N * (C1 + C2)}}$$

where Wn is the natural frequency, omega n, Ki is a primary charge pump current ICP from primary charge pump 538, Kvco is the gain of VCO 514 (FIG. 7), and N is a loop divider value (if present). It will be noted that to maintain a constant value for the natural frequency (omega n), if C1 is lowered (to reduce the physical size), then the primary charge pump current ICP must also be reduced in compensation.

In the FIG. 9 embodiment, loop filter 716 should preferably maintain a target damping factor to ensure that a stable voltage is provided at loop filter output 554 to control VCO 514 (FIG. 7). The damping factor may be expressed according to the following formula:

$$\zeta = \frac{Rd * Wn * C1}{2} * \frac{(IRD + ICP)}{ICP} * \frac{C1}{(C1 + C2)}$$

where Rd is the resistance of damping resistor 546, Wn is the natural frequency (omega n), C1 is the capacitance of capacitor 550, C2 is the capacitance of capacitor 542, ICP is the output current of primary current pump 538, and IRD is the output current of damping current pump 738.

It will be noted in the FIG. 9 embodiment, that to maintain a target damping factor, since omega n is a constant value, although C1 is reduced (to reduce the physical size), the value of damping resistor Rd 546 need not be increased in compensation. Maintaining a constant value (and physical size) for damping resistor Rd 546 is made possible by supplying a separate damping current IRD from damping charge pump 738 at a normal unlowered current level with respect to the lowered primary current ICP from primary current pump 538 (lowered to maintain the natural frequency, omega n, in spite of lowering C1 550). Reducing the physical size of C1 550 and not increasing the physical size of damping resistor Rd 546 is desirable in terms of effectively implementing PLL 710 (FIG. 7) as an integrated circuit.

In comparison with the FIG. 6 embodiment, the embodiment of FIG. 9 provides several significant advantages. First, the relative positions of capacitor C1 550 and damping resistor Rd 546 have been reversed. This arrangement allows unlimited reduction in the size of capacitor C1 550 because the fixed parasitic capacitance Cp is now combined with C1 and C2 as a single value. Secondly, the addition of a second damping charge pump 738 provides a unlowered normal-level damping current IRD that prevents having to increase the value of damping resistor RD 546 for maintaining an adequate damping factor (in spite of supporting a lower value/physical size of capacitor C1 550 through lowering the primary current ICP from primary charge pump 538). For all of the foregoing reasons, the present invention provides an improved system and method for effectively implementing a loop filter device.

The invention has been explained above with reference to certain embodiments. Other embodiments will be apparent to those skilled in the art in light of this disclosure. For example, the present invention may readily be implemented using configurations and techniques other than those described in the embodiments above. Additionally, the present invention may effectively be used in conjunction with systems other than those described above. Therefore, these and other variations upon the discussed embodiments are intended to be covered by the present invention, which is limited only by the appended claims.

What is claimed is:

1. An apparatus for generating an electronic control signal, comprising:
    a loop filter that includes a first capacitor, a second capacitor, and a damping resistor, said first capacitor having a greater capacitance than said second capacitor;
    a primary charge pump that provides a primary charge current to said loop filter; and
    a damping charge pump that provides a damping charge current to said loop filter, said first capacitor having a capacitance value and corresponding physical dimensions that are reduced to fit on an integrated circuit device without compensating by increasing said resistance value of said damping resistor, a resistance value and a corresponding physical size of said damping resistor being constant while maintaining a target damping factor with said damping charge current, said loop filter responsively generating said electronic control signal.

2. The apparatus of claim 1 wherein said electronic control signal regulates the output frequency of a voltage-controlled oscillator.

3. The apparatus of claim 2 wherein said voltage-controlled oscillator is implemented in a phase-locked loop of a telecommunications receiver device.

4. The apparatus of claim 1 wherein said first capacitor, said second capacitor, and said damping resistor are sized to be incorporated within an integrated circuit device.

5. An apparatus for generating an electronic control signal, comprising:
    a loop filter that includes a first capacitor, a second capacitor, and a damping resistor, said first capacitor having a greater capacitance than said second capacitor, said first capacitor having a first end that is connected to a loop filter output, said first capacitor having a second end that is connected to a first end of said damping resistor, said damping resistor having a second end that is connected to a ground potential, said first capacitor having a capacitance value and corresponding physical dimensions that are selected to fit within an integrated circuit;
    a primary charge pump that provides a primary charge current to said loop filter; and
    a damping charge pump that provides a damping charge current to said loop filter, a resistance value and a corresponding physical size of said damping resistor being constant while maintaining a target damping factor with said damping charge current, said loop filter responsively generating said electronic control signal.

6. The apparatus of claim 5 wherein said second capacitor has a first end that is connected to said loop filter output, said second capacitor having a second end that is connected to said ground potential.

7. An apparatus for generating an electronic control signal, comprising:
    a loop filter that includes a first capacitor, a second capacitor, and a damping resistor, said first capacitor having a greater capacitance than said second capacitor, said first capacitor having a first end that is connected to a loop filter output, said first capacitor having a second end that is connected to a first end of said damping resistor, said damping resistor having a second end that is connected to a ground potential, said second capacitor having a first end that is connected to said loop filter output, said second capacitor having a second end that is connected to said ground potential;
    a primary charge pump that provides a primary charge current to said loop filter; and
    a damping charge pump that provides a damping charge current to said loop filter, said loop filter responsively generating said electronic control signal, said loop filter being implemented according to a formula:

$$\frac{C1*C2}{(C1+C2)} < \frac{(C1+C2)}{10}$$

where C1 is a first capacitance of said first capacitor, and C2 is a second capacitance of said second capacitor.

8. The apparatus of claim 6 wherein said primary charge pump generates an ICP output current that is connected to said first end of said first capacitor and said first end of said second capacitor at said loop filter output.

9. The apparatus of claim 8 wherein said damping charge pump generates an IRD output current that is connected to a junction of said second end of said first capacitor and said first end of said damping resistor.

10. The apparatus of claim 9 wherein said ICP output current is less than said IRD output current.

11. An apparatus for generating an electronic control signal, comprising:
    a loop filter that includes a first capacitor, a second capacitor, and a damping resistor, said first capacitor having a greater capacitance than said second capacitor, said first capacitor having a first end that is connected to a loop filter output, said first capacitor having a second end that is connected to a first end of said damping resistor, said damping resistor having a second end that is connected to a ground potential, said second capacitor having a first end that is connected to said loop filter output, said second capacitor having a second end that is connected to said ground potential;
    a primary charge pump that provides a primary charge current to said loop filter; and
    a damping charge pump that provides a damping charge current to said loop filter, said loop filter responsively generating said electronic control signal, said loop filter being implemented according to a formula:

$$\frac{C1 * C2}{(C1 + C2)} < \frac{(C1 + C2)}{10}$$

where C1 is a first capacitance of said first capacitor, and C2 is a second capacitance of said second capacitor, said primary charge pump generating an ICP output current that is connected to said first end of said first capacitor and said first end of said second capacitor at said loop filter output, said damping charge pump generating an IRD output current that is connected to a junction of said second end of said first capacitor and said first end of said damping resistor, said ICP output current being less than said IRD output current, said IRD output current being inversely proportional to a resistance value of said damping resistor.

12. The apparatus of claim 3 wherein said loop filter supports a natural frequency of said phase-locked loop.

13. The apparatus of claim 12 wherein said natural frequency is expressed by a formula:

$$Wn = \sqrt{\frac{Ki \cdot Kvco}{N * (C1 + C2)}}$$

where Wn is said natural frequency, Ki is said ICP output current, Kvco is a gain of a voltage-controlled oscillator, N is a loop divider value, C1 is a first capacitance of said first capacitor, and C2 is a second capacitance of said second capacitor.

14. The apparatus of claim 1 wherein said loop filter provides a damping factor that represents stability characteristics of a phase-locked loop.

15. The apparatus of claim 14 wherein said damping factor is expressed by a formula:

$$\zeta = \frac{Rd * Wn * C1}{2} * \frac{(IRD + ICP)}{ICP} * \frac{C1}{(C1 + C2)}$$

where Rd is a resistance of said damping resistor, Wn is a natural frequency of a phase-locked loop, C1 is a first capacitance of said first capacitor, C2 is a second capacitance of said second capacitor, ICP is an output current of said primary current pump, and IRD is an output current of said damping current pump.

16. An apparatus for generating an electronic control signal, comprising:
a loop filter that includes a first capacitor, a second capacitor, and a damping resistor, said first capacitor having a greater capacitance than said second capacitor, said first capacitor having a first end that is connected to a loop filter output, said first capacitor having a second end that is connected to a first end of said damping resistor, said damping resistor having a second end that is connected to a ground potential, said second capacitor having a first end that is connected to said loop filter output, said second capacitor having a second end that is connected to said ground potential;
a primary charge pump that provides a primary charge current to said loop filter; and
a damping charge pump that provides a damping charge current to said loop filter, said loop filter responsively generating said electronic control signal, a parasitic capacitance being present between said loop filter output and said ground potential.

17. The apparatus of claim 16 wherein said parasitic capacitance is no limitation on reducing a capacitance value and a corresponding physical size of said first capacitor.

18. The apparatus of claim 10 wherein selecting said IRD output current to be higher than said ICP output current maintains a damping factor at an effective level for said loop filter.

19. An apparatus for generating an electronic control signal, comprising:
a loop filter that includes a first capacitor, a second capacitor, and a damping resistor, said first capacitor having a greater capacitance than said second capacitor, said first capacitor having a first end that is connected to a loop filter output, said first capacitor having a second end that is connected to a first end of said damping resistor, said damping resistor having a second end that is connected to a ground potential, said second capacitor having a first end that is connected to said loop filter output, said second capacitor having a second end that is connected to said ground potential;
a primary charge pump that provides a primary charge current to said loop filter; and
a damping charge pump that provides a damping charge current to said loop filter, said loop filter responsively generating said electronic control signal, said loop filter being implemented according to a formula:

$$\frac{C1 * C2}{(C1 + C2)} < \frac{(C1 + C2)}{10}$$

where C1 is a first capacitance of said first capacitor, and C2 is a second capacitance of said second capacitor, said primary charge pump generating an ICP output current that is connected to said first end of said first capacitor and said first end of said second capacitor at said loop filter output, said damping charge pump generating an IRD output current that is connected to a junction of said second end of said first capacitor and said first end of said damping resistor, said ICP output current being less than said IRD output current, a resistance value and a corresponding physical size of said damping resistor being unaffected while maintaining said damping factor with said IRD output current.

20. A method for generating an electronic control signal, comprising:
providing a loop filter that includes a first capacitor, a second capacitor, and a damping resistor, said first capacitor having a greater capacitance than said second capacitor;
utilizing a primary charge pump to provide a primary charge current to said loop filter; and
generating a damping charge current to said loop filter with a damping charge pump, said first capacitor having a capacitance value and corresponding physical dimensions that are reduced to fit on an integrated circuit device without compensating by increasing said resistance value of said damping resistor, a resistance value and a corresponding physical size of said damping resistor being constant while maintaining a target damping factor with said damping charge current, said loop filter responsively generating said electronic control signal.

* * * * *